(12) United States Patent
Deane et al.

(10) Patent No.: US 6,180,438 B1
(45) Date of Patent: Jan. 30, 2001

(54) THIN FILM TRANSISTORS AND ELECTRONIC DEVICES COMPRISING SUCH

(75) Inventors: Steven C. Deane, Redhill; Ian D. French, Hove, both of (GB)

(73) Assignee: U.S. Philips Corporation, New York, NY (US)

( * ) Notice: Under 35 U.S.C. 154(b), the term of this patent shall be extended for 0 days.

(21) Appl. No.: 09/209,079

(22) Filed: Dec. 10, 1998

(30) Foreign Application Priority Data

Dec. 13, 1997 (GB) .................................................. 9726511

(51) Int. Cl.$^7$ .............................. H01L 21/00; H01L 21/84
(52) U.S. Cl. ......................... 438/149; 438/161; 438/162; 257/52; 138/258
(58) Field of Search ..................................... 438/149, 161, 438/162, 147, 163; 257/52, 65, 287, 51; 136/258; 422/186.05

(56) References Cited

U.S. PATENT DOCUMENTS

| | | | |
|---|---|---|---|
| 4,203,123 | * | 5/1980 | Shanks ..................................... 257/2 |
| 5,130,829 | | 7/1992 | Shannon .................................. 359/59 |
| 5,151,255 | * | 9/1992 | Fukuda et al. .................. 422/186.05 |
| 5,512,494 | * | 4/1996 | Tanabe .................................. 438/161 |
| 5,591,989 | * | 1/1997 | Miyasaka et al. ...................... 257/76 |
| 5,777,364 | * | 7/1998 | Crabbe et al. ........................ 257/347 |
| 5,879,970 | * | 3/1999 | Shiota et al. .......................... 438/151 |
| 6,049,091 | * | 4/2000 | Yokoyama ............................. 257/52 |

FOREIGN PATENT DOCUMENTS

0179914B1  5/1986  (EP) .............................. G02F/1/133
0276340B1  8/1988  (EP) .............................. G02F/1/133

OTHER PUBLICATIONS

Hae–Yeol Kim et al., The influence of hydrogen dilution ratio on the crystallization of hydrogenated amorphous silicon films prepared by plasma–enhanced chemical vapor deposition, Thin Solid Films, Jan. 1997, pp 17–24.*

N. Gonzalez et al., Optoelectronic properties of doped layers for a–Si solar cells prepared using helium dilution, Solar Energy Materials and Solar Cells, Jan. 1997, pp 175–184.*

"An Ohmic Contact Formation Method for Fabricating x–Si TfTs on Large Size Substrates" by Yukawa et al published in Proceedings of the 9th International Dispaly Research Conference, Oct. 16–18, 1989, Kyoto.Japan, Japan Display '89, at pp. 506–509.

* cited by examiner

Primary Examiner—Olik Chaudhuri
Assistant Examiner—William David Coleman
(74) Attorney, Agent, or Firm—John C. Fox

(57) ABSTRACT

In an electronic device, such as an active matrix display device or the like, comprising a top gate amorphous silicon thin film transistor (10) in which one or both of the source and drain electrodes (15, 16) is of transparent conductive material such as ITO, the PECVD deposited semiconductor layer (18) extending over and between the source and drain electrodes of the TFT is formed as first and second sub-layers (18A, 18B), using different source gas compositions. A noble inert gas such as helium is used as dilutant in forming the first sub-layer adjacent the source and drain electrodes to avoid reduction problems while hydrogen is used as the dilutant in forming the second sub-layer to achieve high stability and mobility characteristics in the completed transistor.

8 Claims, 3 Drawing Sheets

THIN FILM TRANSISTORS AND ELECTRONIC DEVICES COMPRISING SUCH

BACKGROUND OF THE INVENTION

This invention relates to electronic devices comprising a thin-film transistor and methods of manufacturing such. The device may be a flat panel display, for example, an active-matrix liquid-crystal display, or another type of large-area electronic device, for example, a large-area image sensor or touch sensor, or a thin-film data store or memory device.

There is currently much interest in developing thin-film circuits with thin-film transistors (hereinafter termed "TFTs") on glass and on other inexpensive insulating substrates for large-area electronics applications. Such TFTs may form the switching elements in a cell matrix, for example in a flat panel display as described in U.S. Pat. No. 5,130,829, and/or in integrated drive circuits for such cell matrices.

In the development and manufacture of large-area electronic devices, it is recognised that the performance of the TFTs can depend critically on the quality of the electrical contact between the source and drain electrodes and the semiconductor layer providing the channel region. There is a need to be able to form good quality contacts reproducibly and hence uniformly. A variety of materials are known for the electrodes and semiconductor layers. The semiconductor layer is usually of silicon in an amorphous or microcrystalline or polycrystalline form. The silicon-based regions may be contacted by electrodes of, for example, chromium, molybdenum, aluminium, and indium tin oxide (ITO). These electrodes may themselves be contacted by a conductive film which forms a pattern of interconnection tracks between these circuit elements. In most situations it is desirable for the electrode to make an ohmic contact of low resistance with the semiconductor.

One particular form of TFT is the so-called top-gate staggered TFT in which the source and drain electrodes are provided underneath an amorphous silicon semiconductor layer and adjacent the substrate surface and the gate is provided on the other side of the semiconductor layer remote from the substrate surface. Examples of such a TFT used in an active matrix LCD are described in EP-B-0 179 914 and EP-B-0276340. In these devices, the source and drain electrodes are formed of ITO material from a deposited ITO layer which is used also to provide pixel electrodes and column lines for data signals, and an intrinsic amorphous silicon semiconductor layer formed by a PECVD (Plasma Enhanced Chemical Vapour Deposition) process extends between the source and drain electrodes to provide a channel region. Regions of the amorphous silicon semiconductor layer which extend over the source and drain electrodes may be doped (n+) to provide ohmic contacts.

One particular problem experienced with these kinds of TFTs is that it is difficult to make good quality contacts between the source and drain electrodes and the amorphous silicon layer reproducibly and hence uniformly. It is believed that when the amorphous silicon material is deposited by a PECVD process using a standard source gas composition having a hydrogen gas content, such as silane ($SiH_4$) with $H_2$, at a temperature of around 250° C., as commonly used for amorphous silicon deposition, hydrogen reduction of the underlying ITO material can occur. Attempts to vary the source gas composition with the aim of reducing or avoiding this problem have tended to result in TFTs exhibiting poorer performance, particularly as regards stability and mobility, in subsequent use.

Another example of such a TFT is described in the paper entitled "An Ohmic Contact Formation Method for Fabricating α-Si TFTs on Large Size Substrates" by Yukawa et al published in Proceedings of the 9th International Display Research Conference, Oct. 16–18, 1989, Kyoto, Japan, Japan Display '89, at pages 506–509. The paper describes previous difficulties in making uniform low-resistance contacts for bottom drain and source electrodes to the silicon film of a top-gate TFT. These difficulties, it is said, had resulted in most flat panel displays being formed with bottom-gate TFTs, in spite of the many advantages of top-gate TFTs. The paper proposes avoiding these difficulties by doping the amorphous silicon semiconductor layer with phosphorus from the ITO source and drain electrode patterns. Thus, a film of ITO deposited on a substrate is etched to form a desired pattern of pixel electrodes and source and drain electrodes and tracks for the TFTs, and this ITO pattern is then exposed to an RF glow discharge of $PH_3$ (phosphine). As a result, phosphorus dopant is adhered to the surface of the IT0 pattern. After an optional etching stage, an undoped hydrogenated amorphous silicon film is then deposited using a PECVD process to provide the channel region of the TFT. During this deposition, n+ regions are formed in the amorphous silicon film adjacent the ITO pattern by phosphorus diffusion from the surface of the ITO. This doping of the semiconductor film from the ITO source and drain electrodes is intended to give a good quality low resistance ohmic contact for the source and drain electrodes of the TFT. However, it has been found that although some improvement in the quality of the contacts between the source and drain electrodes and the amorphous silicon layer can result when using source gas compositions comprising $SiH_4$ and $H_2$ for the silicon layer deposition, similar undesirable interactions with the ITO, in the form of hydrogen reduction, can still occur so that any improvement is still limited. Moreover, the fabrication process entailed involves further processing steps which add to the complexity of manufacture.

OBJECTS AND SUMMARY OF THE INVENTION

It is an object of the present invention, therefore, to provide an electronic device having a top-gate TFT which has improved quality source and drain contacts that can be provided reliably and reproducibly.

It is another object of the present invention to provide a top gate TFT having improved quality source and drain contacts and in which the stability and mobility of the TFT is not impaired.

According to the present invention there is provided a method of manufacturing an electronic device comprising a top gate TFT, including the steps of forming spaced source and drain electrodes on a substrate, at least one of which electrodes comprises transparent conductive material, depositing an amorphous silicon semiconductor layer by a plasma CVD process over and between the source and drain electrodes for providing a channel region of the TFT, and forming a gate insulator layer and a gate electrode over the semiconductor layer, which is characterised in that the amorphous silicon material forming the amorphous silicon semiconductor layer is deposited initially using a noble inert gas diluted plasma to form a first sub-layer adjacent the source and drain electrodes and thereafter using a hydrogen diluted plasma to form a second sub-layer overlying the first sub-layer over which the gate insulator layer is provided.

The present invention is based on an appreciation by the present inventors that using a noble inert gas diluted plasma in the deposition the semiconductor layer can avoid, or at least reduce, hydrogen reduction of the underlying source and drain electrodes during deposition, but the nature of a resulting amorphous silicon semiconductor layer formed entirely by such a process leads to problems of poor stability and mobility in operation of the completed TFT. By depositing the semiconductor layer in two sub-layers using different recipes, the stability and mobility problems can be overcome whilst at the same time avoiding reduction of the source and drain electrodes. The latter result is achieved by virtue of the noble inert gas in the plasma of the composition used for deposition of the first sub-layer. The hydrogen diluted plasma gas used to form the second, overlying, sub-layer results in the TFT having good stability and mobility characteristics, corresponding to those obtained when such a source gas composition is used to produce the whole of the TFT's semiconductor layer. The channel region of the completed TFT is formed predominantly in this second sub-layer.

The noble inert gas preferably comprises helium or argon. Helium may though be expected to achieve particularly good results.

The source gas composition used to deposit the amorphous silicon semiconductor layer preferably comprises silane.

The invention is applicable especially to TFTs whose source and/or drain electrode comprises ITO material. However, the invention can also prove effective in cases where the different transparent conductive materials are used for the electrode. The most common alternative materials similarly comprise oxides, such as tin oxide, aluminium doped zinc oxide and aluminium doped tin oxide, and likewise are susceptible to reduction.

The electronic device may comprise an array of such top gate TFTs fabricated simultaneously from common deposited layers on a common substrate as used in a flat panel display device, such as an active matrix liquid crystal display device, or other large area device, for example image sensor, incorporating such an array.

BRIEF DESCRIPTION OF THE DRAWING

Embodiments of electronic devices comprising a top gate TFT, their method of manufacture and a flat panel display device using an array of such TFTs, all in accordance with the present invention, will now be described, by way of example, with reference to the accompanying diagrammatic drawings, in which.

DESCRIPTION OF THE PREFERRED EMBODIMENTS

Figure 1:
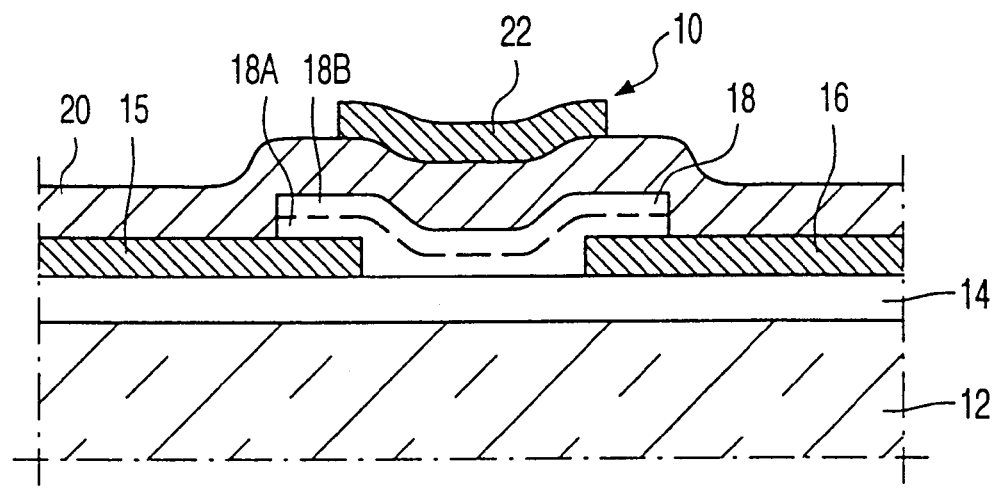
FIG. 1 is a cross-sectional view through a TFT in a part of an electronic device according to the invention.

It should be understood that the Figures are merely schematic and are not drawn to scale. Certain dimensions, such as the thicknesses of layers or regions, may be shown exaggerated while other dimensions may have been reduced for the sake of clarity. The same reference numerals are used throughout the drawings to indicate the same or similar parts.

FIG. 1 illustrates a part of a large area electronic device which may be, for example, a flat panel display device of similar kind to the active matrix liquid crystal display device described in U.S. Pat. No. 5,130,829. Thus, a back plate of the display device may provide a substrate on a first major surface of which the TFT of FIG. 1, generally referenced at 10, is provided. The TFT 10 comprises an amorphous silicon TFT of the so-called top gate staggered variety. The substrate is electrically insulating at least adjacent its major surface and may comprise glass or another insulating material such as a plastics material. In this particular embodiment the substrate comprises a glass plate 12 having on its upper surface a deposited layer 14 of insulating material, such as silicon dioxide or silicon nitride, although this layer could be omitted if desired. A large number of individual TFTs are formed side by side on the substrate and interconnected by thin film conductor patterns such as the conductive tracks.

The TFT comprises spaced source and drain electrodes, 15 and 16 respectively, of ITO material formed from a layer of ITO deposited directly on the surface of the layer 14. A deposited layer 18 of intrinsic, hydrogenated, amorphous silicon semiconductor (a—Si:H) material extends between the source and drain electrodes over the intervening surface of the insulating layer 14 and onto the upper surface of the ends of the source and drain electrodes and provides the TFT's channel region extending between these electrodes. A gate insulator layer 20, for example of silicon nitride or silicon dioxide, extends directly over the semiconductor layer 18, and adjacent regions, and on top of this layer 20, a gate electrode 22, for example of a metal such as aluminium, is provided overlying the region of the semiconductor layer 18 between the source and drain electrodes 15 and 16.

The undoped amorphous silicon semiconductor layer 18 consists of first and second sub-layers 18A and 18B produced using different source compositions. The sub-layer 18A closest to the substrate 12 is intended to achieve good ohmic electronic contact with the ITO source and drain electrodes. More especially, the manner in which the first sub layer 18A is provided is chosen so as to avoid the possibility of the surface regions of ITO source and drain electrodes being reduced when depositing the semiconductor layer 18. To this end, a helium diluted plasma is used in the PECVD process when forming this sub-layer 18A. A complete amorphous silicon semiconductor layer produced in this way however tends not to exhibit good stability and mobility properties when used to provide the channel region in a TFT and can lead over of a period of subsequent operation of the TFT to a shift in the threshold voltage characteristic of the TFT and a lower mobility than is normally required. Another noble inert gas such as argon could be used to similar effect instead of helium for the gas content of the source composition but this too results in the resulting semiconductor layer having relatively poor stability and mobility characteristics.

The nature of the second sub-layer 18B directly overlying the sub-layer 18A is selected so as to provide good stability and mobility characteristics. To this end, the sub-layer 18B is formed by a PECVD process using a hydrogen diluted plasma. In operation of the completed TFT the channel region of the TFT is formed principally in the second sub-layer 1 8B, as it is closer to the gate electrode, and so the operational characteristics of the TFT generally correspond with those of a TFT having a unitary semiconductor layer formed using only a hydrogen diluted plasma.

Thus, as a result of providing the amorphous silicon semiconductor layer 18 in the form of two sub-layers whose respective deposition properties are selected accordingly, good electrical contact between the semiconductor layer 18 and the ITO source and drain electrodes 15 and 16 is obtained whilst at the same time the TFT demonstrates high mobility and stability in operational use, similar to that obtained with a bottom gate TFT structure.

Figure 3A:
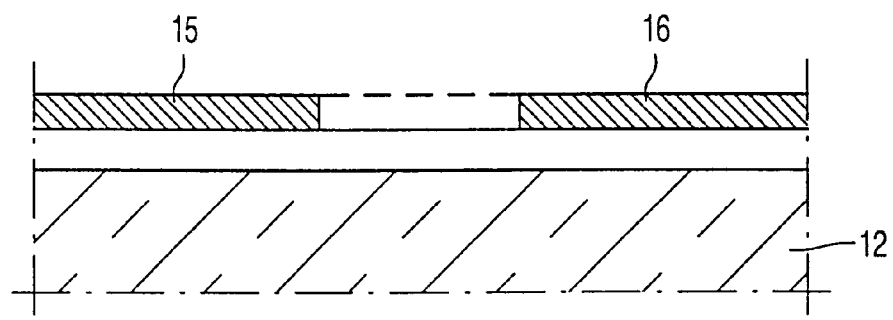
FIGS. 3A to 3C illustrates various stages in the fabrication of the TFT of FIG. 1.
Figure 3B:
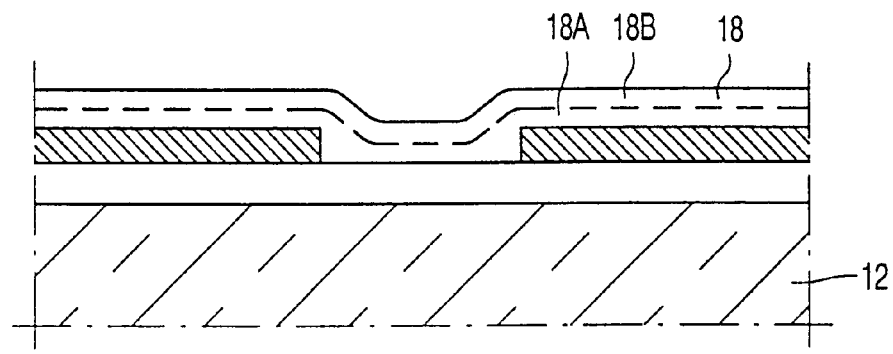

The TFT 10 is fabricated by depositing a layer of ITO, for example by sputtering, over the surface of the substrate 12 and photolithographically patterning and etching this layer using conventional processes to leave selected regions including the source and drain electrode regions, as shown in FIG. 3A, together with integral connection extensions. This structure is then placed in a deposition chamber and the semiconductor layer 18 formed using a PECVD (plasma enhanced chemical vapour deposition) process. Prior to the deposition of the amorphous silicon material, a selective phosphorus deposition step is preferably carried out, as described in the aforementioned paper by Yukawa et al, so that phosphorus dopant adheres to the surface of the ITO pattern which serves to form doped, n+, regions in the subsequently deposited amorphous silicon layer adjacent the ITO pattern by diffusion from the surface of the ITO. An amorphous silicon film is deposited completely over the substrate using this process. Initially, the deposition of this film is carried out at a temperature up to around 240° C. from a source gas mixture in which silane ($SiH_4$) is used as the silicon source and helium is used as the dilutant. The absence of hydrogen in the separate gas content means that the extent of hydrogen reduction of the exposed surface regions of the ITO regions at this initial stage is significantly reduced. This deposition is continued until the semiconductor film reaches predetermined thickness of around 10 to 20 nm, forming a first sub-layer 18A. During this process, the regions of the semiconductor film 18 directly overlying the ITO source and drain electrodes become doped, n+, regions through diffusion of the phosphorus dopant. The deposition conditions are then changed such that amorphous silicon is deposited from a gas mixture of silane and hydrogen gas as the dilutant at around the same temperature to form a second sub-layer 18B. It will be appreciated that it is not necessary to remove the substrate from the deposition chamber for this. Deposition of the amorphous silicon is continued until the overall thickness of the film 18 reaches around 40 nm to produce the structure shown in FIG. 3B in which the dotted line denotes the level in the deposited semiconductor film at which the deposition parameters were changed and hence the boundary between the two resulting sub-layers 18A and 18B of amorphous silicon. The ratio of helium (or argon) to silane and hydrogen to silane used in the source gas compositions in these deposition processes is selected to be at least 2 to 1 and preferably higher. The pressure used can vary according to the actual reactor geometry.

Both the resulting sub-layers 18A and 18B have a composition comprising around 10% hydrogen in silicon.

Before the structure is removed from the deposition chamber, at least part of the gate insulator layer 20, for example silicon nitride, is deposited to protect the semiconductor layer and provide a semiconductor/insulator interface free from contaminants.

Factors of the amorphous silicon deposition process other than hydrogen content which contribute to the reduction of the ITO source and drain electrodes include the temperature and pressure at which deposition takes place. In order to obtain a high quality amorphous silicon layer it is normally desirable to use a high temperature, between 250 to 300° C., a relatively low pressure and high hydrogen dilution, all of which tend to aggravate the hydrogen reduction problem.

The use of helium, or other noble inert gas like argon, to dilute the plasma increases the temperature at which hydrogen reduction of the ITO occurs. Thus the temperature of the PECVD process used to form the first sub-layer 18A can be increased slightly to compensate to an extent for the reduced hydrogen content, enabling an adequate quality first sub-layer to be obtained.

Figure 3C:
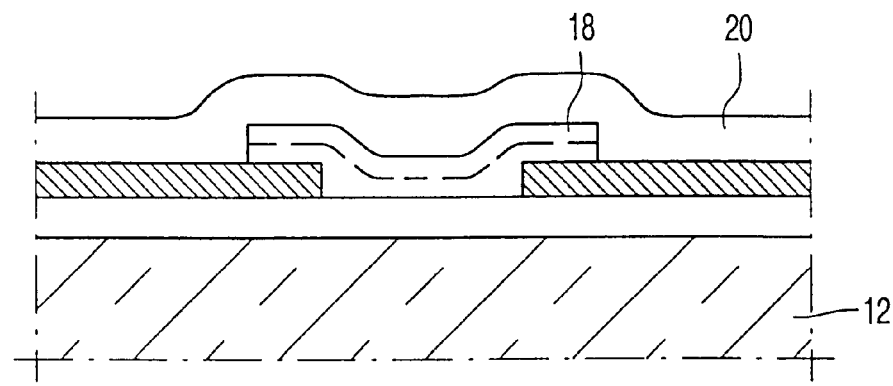

After removal the substrate from the PECVD deposition chamber, the film 18 and the overlying insulator material are subjected to patterning by a known photolithographic and etching process to define the required region of the semiconductor layer 18 extending over the ITO source and drain electrodes and the intervening substrate surface. This is followed by the deposition and patterning of a further layer of insulator if needed to complete the gate insulator layer 20, as shown in FIG. 3C, and then the deposition of a metal layer, for example aluminium, and patterning of this layer to form the gate electrode 22 in conventional manner, so as to result in the structure of FIG. 1.

Figure 2:
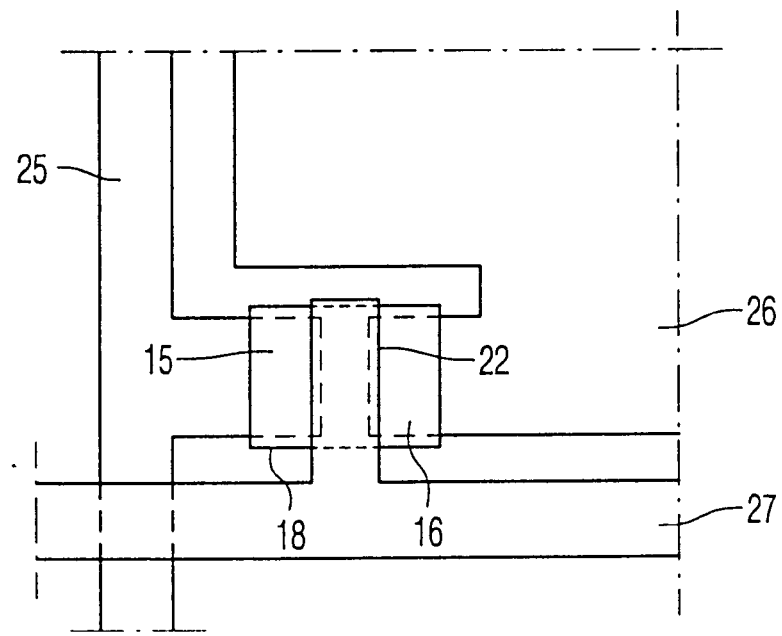
FIG. 2 is a plan view of the TFT.
Figure 4:
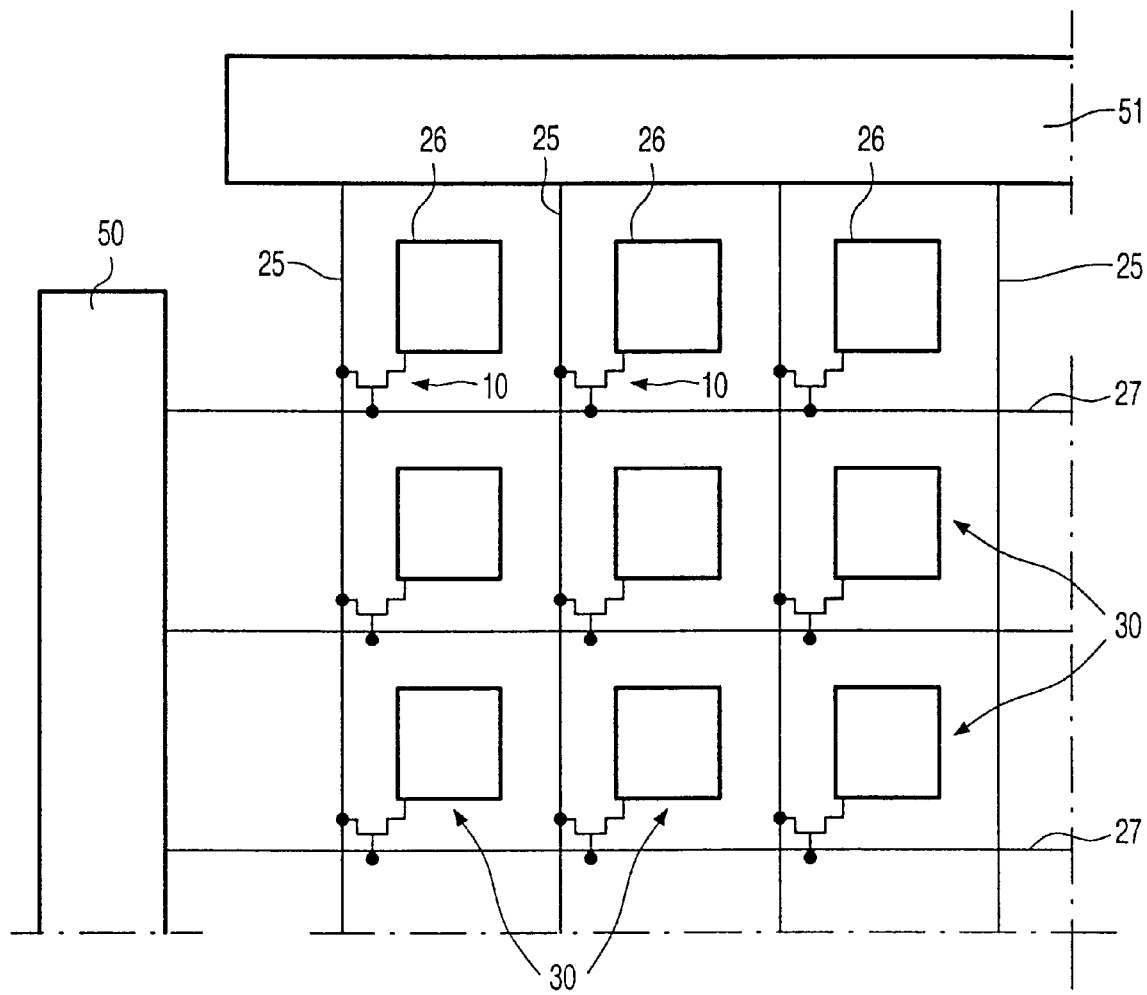
FIG. 4 is a schematic circuit diagram of part of an active matrix liquid crystal display device using an array of TFTs.
Figure 5:
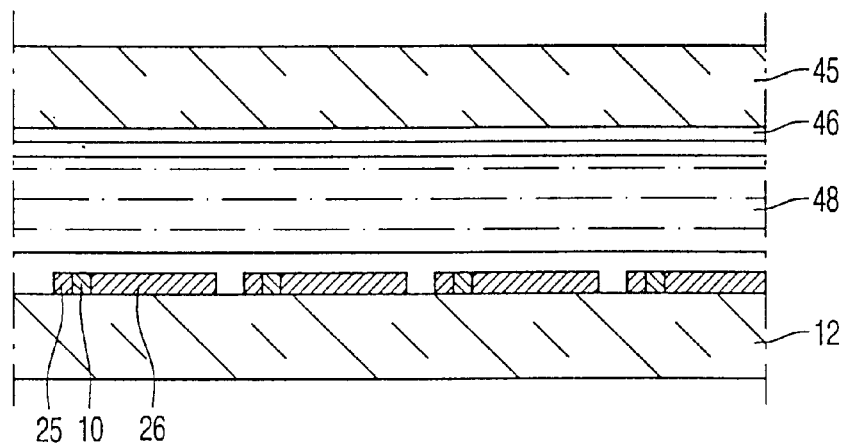
FIG. 5 shows section through part of the liquid crystal display device.

FIG. 2 shows the completed TFT in schematic plan view in the case of the electronic device comprising a flat display panel, which in this example comprises an active matrix liquid crystal display panel. As shown in FIG. 2, the ITO source and drain contacts comprise integral parts of a column address line 25 and display element electrode 26 respectively which are defined simultaneously with the source and drain electrodes when patterning the deposited ITO layer. Similarly, the deposited metal layer used for the gate electrode is used also to form a row address line 27 with the gate electrode comprising an integral extension of the line 27. The deposited layer of insulating material used for the gate insulator extends between the row and column address lines at the region of their cross-over. Individual TFTs of the array are interconnected via associated row and column address lines in conventional manner as depicted in FIG. 4 with the gate electrodes of all the TFTs in one row being connected to a respective row address line 27 and the source contacts of all the TFTs in one column being connected to a respective column address line 25. This structure forms the active matrix plate of the display panel with each TFT and its associated electrode 26 constituting an individually addressable pixel element 30. The sets of row and column address lines 27 and 25 are connected at their ends to a row driver circuit 50 and column driver circuit 51 respectively which drive the pixel elements. Referring also to FIG. 5, another transparent plate 45, for example of glass, carrying one, or more, transparent conductive electrodes 46 is disposed over this plate, with spacers disposed therebetween, and the two plates are sealed together around their periphery leaving a small gap between their facing major surface into which liquid crystal material 48 is introduced to provide a conventional form of active matrix LC display panel similar to that described in aforementioned U.S. Pat. No. 5,130,829 for example. In operation, a gating signal is applied by the circuit 50 to each row address line 27 in sequence so as to turn on the TFTs of each row in turn, and video data signals are applied by the circuit 51 to the column address lines in synchronisation with the gating signal so that charge is transferred via each TFT of a selected row to its associated display element electrode 26 which, together with a reference potential applied to the electrode 46 on the other plate produces a desired light modulating effect from the intervening liquid crystal material. Each row is scanned in turn in this manner to build up a complete display picture in one field.

Various modifications are possible. For example, the source and drain electrodes need not comprise ITO material but could be formed from another transparent conductive material such as tin oxide or aluminium doped zinc oxide or tin oxide. Most suitable transparent conductive materials comprise oxides and this would similarly be susceptible to hydrogen reduction when depositing the overlying amorphous silicon layer.

Only one of the source and drain electrodes may be formed from transparent conductive material. Possibly, the source electrode, and the column address lines 25 in the display panel embodiment, could be formed from a metal since they may not need to be transparent. However, this would entail these components being formed separately from the drain electrodes and display element electrodes and thus complicate the fabrication process.

References to the use of silane in the source gas composition used is intended to include disilane and trisilane. It is envisaged that a silicon source other than silane could be used in the source gas composition, for example silicon tetrafluoride.

The ends of the sub-layer 18B of the amorphous silicon layer overlying the source and drain electrodes 15 and 16 may be doped, for example, by implantation to form n+ regions which contact the source and drain electrodes, rather than by using the aforementioned phosphorus deposition technique as described by Yukawa et al.

Doping of these regions of the semiconductor layer may not always be necessary and in a simple embodiment, therefore, such doping may be omitted and instead intrinsic amorphous silicon material of the layer 18A may simply overlie the source and drain electrodes.

From reading the present disclosure, other modifications will be apparent to persons skilled in the art. Such modifications may involve other features which are already known in the field of TFTs and large area electronic devices such as active matrix display devices and component parts thereof and which may be used instead of or in addition to features already described herein.

What is claimed is:

1. A method of manufacturing an electronic device comprising a top gate TFT, comprising the steps of forming spaced source and drain electrodes on a substrate, at least one of which electrodes comprise transparent conductive material, depositing an amorphous silicon semiconductor layer by a plasma CVD process over and between the source and drain electrodes for providing a channel region of the TFT, and forming a gate insulator layer and a gate electrode over the semiconductor layer, characterised in that the amorphous silicon semiconductor layer is deposited initially using a noble inert gas diluted plasma to form a first sub-layer adjacent the source and drain electrodes and thereafter using a hydrogen diluted plasma to form a second sub-layer overlying the first sub-layer over which the gate insulator layer is provided.

2. A method according to claim 1, characterised in that the noble inert gas comprises helium.

3. A method according to claim 1, characterised in that the noble inert gas comprises argon.

4. A method according to claim 1, characterised in that the silicon source used in the deposition of the amorphous silicon semiconductor layer comprises silane.

5. A method according to claim 1, characterised in that prior to depositing the amorphous silicon semiconductor layer a dopant is applied to the surface of the source and drain electrodes.

6. A method according to claim 1, characterised in that the transparent conductive material comprises ITO.

7. A method according to claim 1, characterised in that a plurality of said TFTs are formed simultaneously on the substrate.

8. A method according to claim 7, characterised in that the device comprises an active matrix display device and in that the drain electrodes of the TFTs are formed integrally with respective display element electrodes on the substrate.

* * * * *